United States Patent [19]

Masuda et al.

[11] Patent Number: 5,646,892
[45] Date of Patent: Jul. 8, 1997

[54] DATA READING CIRCUIT

[75] Inventors: Shinichi Masuda; Hiroshi Segawa, both of Hyogo, Japan

[73] Assignees: Mitsubishi Electric Engineering Co., Ltd.; Mitsubishi Denki Kabushiki Kaisha, both of Tokyo, Japan

[21] Appl. No.: 462,433

[22] Filed: Jun. 5, 1995

[30] Foreign Application Priority Data

Sep. 13, 1994 [JP] Japan .................. 6-218838

[51] Int. Cl.$^6$ ..................................... G11C 11/34
[52] U.S. Cl. ..................... 365/189.05; 365/189.01; 365/196; 365/207; 365/205; 365/190
[58] Field of Search .................... 365/189.01, 189.05

[56] References Cited

U.S. PATENT DOCUMENTS

| | | | |
|---|---|---|---|
| 5,539,691 | 7/1996 | Kozaru et al. | 365/189.05 |
| 5,557,581 | 9/1996 | D'Souza | 365/233 |
| 5,579,267 | 11/1996 | Koshikawa | 365/189.05 |
| 5,583,814 | 12/1996 | Iwamura et al. | 365/189.05 |

FOREIGN PATENT DOCUMENTS

| | | |
|---|---|---|
| 0 427 286 A2 | 5/1991 | European Pat. Off. . |
| 0 439 407 A2 | 7/1991 | European Pat. Off. . |
| 1-133121 | 5/1989 | Japan . |
| 3-256298 | 11/1991 | Japan . |
| 4-82089 | 3/1992 | Japan . |
| 5-217376 | 8/1993 | Japan . |

OTHER PUBLICATIONS

Yasoji Suzuki, "Applied Technology for CMOS", Sanpo-Shuppan Co. Ltd., pp. 111, 114–115, Nov., 1976.
Masahiko Yoshimoto et al., "A Divided World-Line Structure in the Static RAM and Its Application to a 64K Full CMOS RAM", IEEE Journal of Solid-State Circuits, vol. SC-18, No. 5, pp. 479–485, Oct., 1983.

*Primary Examiner*—Viet Q. Nguyen
*Attorney, Agent, or Firm*—Lowe, Price, LeBlanc & Becker

[57] ABSTRACT

In a data reading circuit, an output signal from a sense amplifier which outputs a signal having a level corresponding to a potential difference between an input/output line pair is output through a first tri-state inverter and a second tri-state inverter. An NMOS transistor for precharging is provided between an output node of the first tri-state inverter and an output node (N3) of the sense amplifier. When the sense amplifier and the first tri-state inverter are inactivated, this transistor is also inactivated. As a result, an output node of the second tri-state inverter and an output node of the sense amplifier are connected with this transistor therebetween, so that the output node of the sense amplifier is precharged to an intermediate potential. According to the structure as described above, in the data reading circuit, a fast access is implemented, operation of the circuit is stabilized, and the lack of balance between the access times is suppressed.

2 Claims, 8 Drawing Sheets

DATA READING CIRCUIT

BACKGROUND OF THE INVENTION

1. Field of the Invention

The present invention relates to a data reading circuit used in a semiconductor memory device, and in particular, to a data reading circuit for reading data conducted from a memory cell to an input/output line pair.

2. Description of the Background Art

In a semiconductor memory device, data is written into a memory cell. In such a semiconductor memory device, a data reading circuit is provided for reading data written into the memory cell. When reading the data from the memory cell, the data stored in the memory cell is conducted to a bit line pair. Then, the data is conducted to an input/output line pair from the bit line pair through a column selecting gate or the like.

The data reading circuit is connected to the input/output line pair. This data reading circuit senses and amplifies the potential difference produced at the input/output line pair corresponding to the data conducted from the memory cell, and externally outputs the read data at a level corresponding to the potential difference.

FIG. 7 is a circuit diagram of a conventional data reading circuit.

Referring to FIG. 7, this data reading circuit includes a sense amplifier 1, tri-state inverters 2 and 3, a static latch circuit 4, and a P channel MOS transistor (hereinafter referred to as PMOS transistor) 55.

Sense amplifier 1 has a pair of input nodes to which a pair of input/output lines IO and $\overline{IO}$ are connected. In addition, sense amplifier 1 receives a sense enable signal SE as a control signal.

PMOS transistor 55 for precharging is connected between a potential node N1 which receives a power supply potential Vdd and a node N3 which serves as an output node of sense amplifier 1. This PMOS transistor 55 receives sense enable signal SE at its gate electrode.

Tri-state inverter 2 is an inverter for amplifying the signal amplitude. This tri-state inverter 2 is supplied with a signal output from sense amplifier 1. Also, tri-state inverter 2 receives sense enable signal SE as a control signal.

Static latch circuit 4 includes inverters 41 and 42 forming a latch circuit in which an input terminal of one inverter is connected to an output terminal of the other inverter and an output terminal of one inverter is connected to an input terminal of the other inverter. In this static latch circuit 4, a node between the output terminal of inverter 42 and the input terminal of inverter 41 is connected to a node N4 which serves as an output node of tri-state inverter 2.

Tri-state inverter 3 is an inverter for output. This tri-state inverter 3 is supplied with a signal output from tri-state inverter 2. In addition, tri-state inverter 3 receives an output enable signal OE as a control signal. Output signal of tri-state inverter 3 is supplied to a node N5 which serves as an output node.

Operation of the data reading circuit shown in FIG. 7 will now be described.

When sense enable signal SE is at L level, sense amplifier 1 and tri-state inverter 2 would both be in an inactive state (high impedance state), and at the same time, PMOS transistor 55 is rendered conductive.

When PMOS transistor 55 is rendered conductive, power supply potential Vdd is supplied to node N3. Thus, when sense amplifier 1 is inactive, node N3 is precharged to the level of power supply potential Vdd. This precharging is performed so as to improve the access rate.

Thereafter, when sense enable signal SE attains H level, both of sense amplifier 1 and tri-state inverter 2 are made active, and at the same time, PMOS transistor 55 is rendered non-conductive. In this case, potential difference between input/output line pair IO and $\overline{IO}$ is sensed and amplified at sense amplifier 1. As a result, sense amplifier 1 outputs a signal having a level corresponding to the state of signals (the state of potential difference) at input/output line pair IO and $\overline{IO}$.

In this case, tri-state inverter 2 would invert, amplify, and output the signal input thereto. Here, the amplitude of the input signal is amplified.

Static latch circuit 4 latches the output signal of tri-state inverter 2 by inverters 41 and 42. Thus, potential at node N4 is maintained by static latch circuit 4.

Tri-state inverter 3 is activated in response to output enable signal OE. When activated, tri-state inverter 3 inverts the input signal and outputs the inverted signal.

Operation in which two data are successively read (hereinafter referred to as successive reading operation) in the data reading circuit of FIG. 7 will be described next.

There are four types of successive reading operations. In a first successive reading operation, data is read in the order of H level-H level. In a second successive reading operation, data is read in the order of H level-L level. In a third successive reading operation, data is read in the order of L level-L level. In a fourth successive reading operation, data is read in the order of L level-H level.

FIG. 8 is a timing chart for the successive reading operations in the data reading circuit shown in FIG. 7.

This FIG. 8 shows an example in which the first to fourth successive reading operations are performed continuously. In addition, sense enable signal SE, potential of node N3, potential of node N4 and potential of node N5 in each successive reading operation are shown, respectively. When these successive reading operations are performed, output enable signal OE is fixed at H level.

To begin with, the first successive reading operation will be described. First, in an initial sense cycle (a cycle in which a sensing operation is performed) SC, data at H level (the level of power supply potential Vdd) is read out.

Then, node N3 is precharged to H level in a precharge cycle (a cycle in which precharging is performed), and in addition, data at H level is read in the next sense cycle SC.

In this situation, since node N3 continues to be at H level, node N4 continues to be at H level. Accordingly, there is no problem caused in the access time in the case of this first successive operation.

Next, the second successive reading operation will be described. Here, data at H level is read in an initial sense cycle SC. Thereafter, node N3 is precharged to H level in a precharge cycle PC, and data at L level (the level of ground potential gnd) is read in the next sense cycle SC.

In this case, since L level is read after the precharging of node N3 to H level in the precharge cycle PC, it takes a long time before the level of node N3 is turned to H level. Accordingly, rate of access in access time Tac3 is made slower.

Furthermore, in the operation of tri-state inverter 2, it takes a long time before the signal level reaches a logical threshold value when the input amplitude is large. Thus, in the second successive reading operation, the access is further slowed down.

The third successive reading operation will be described next. Here, an L level data is read in an initial sense cycle SC. Then, in a precharge cycle PC, node N3 is precharged to H level, and data of L level is read in the next sense cycle SC.

In this case, the potential at node N3 is first raised to H level by precharging, and then is lowered to L level in the following sense cycle SC. Accordingly, it takes a long time to lower the potential at the latter sense cycle SC. Thus, the access time is made longer and the potential at node N4 is temporarily made lower due to such a delay of access.

However, even when the potential at node N4 is changed as described above, static latch circuit 4 retains the data which is read in the former sense cycle SC so that the potential at node N5 is not changed.

Thus, it can be understood that in the third successive reading operation, there is a problem that the operation would be unstable.

The fourth successive reading operation will now be described. In this case, data at L level is read first in an initial sense cycle SC. Thereafter, in precharge cycle PC, node N3 is precharged to H level, and then data of H level is read in the following sense cycle SC.

Here, the potential at node N3 is increased so as to attain H level by precharging before it is turned to H level in the latter sense cycle SC.

As such, in the fourth successive reading operation, there is no problem caused in the access time Tac4.

As has been described above, the precharging of node N3 at the output side of the sense amplifier to the power supply potential would cause the following three problems.

The first problem is that it would cause increase in the access time as in the case of the second successive reading operation. The second problem is that the operation would be unstable as was the case in the third successive reading operation. The third problem is that there would be a lack of balance between the access times owing to the difference between the access times of the second and the fourth successive reading operations.

SUMMARY OF THE INVENTION

It is an object of the present invention to provide a data reading circuit in which a faster access is achieved. It is another object of the present invention to stabilize the operation of a data reading circuit. It is a further object of the present invention to provide a data reading circuit which can suppress the lack of balance between its access times.

The data reading circuit in accordance with the present invention operates in response to provision of supply voltage defined by first and second potentials to read the data conducted from a memory cell to an input/output line pair, and includes a sense amplifier, a first tri-state inverter, a latch circuit, a second tri-state inverter and a precharging circuit.

The sense amplifier receives a first control signal, is activated in response to that first control signal, senses and amplifies the potential difference produced at the input/output line pair corresponding to the data conducted from the memory cell, and outputs a signal having a level corresponding to that potential difference.

The first tri-state inverter is activated upon the activation of the sense amplifier, and the signal output from the sense amplifier is inverted, amplified and output by the first tri-state inverter. The latch circuit latches the signal output from the first tri-state inverter.

The second tri-state inverter receives a second control signal, is activated in response to that second control signal, and inverts and outputs the signal latched by the latch circuit.

The precharging circuit is activated when the sense amplifier is not activated, and precharges the output node of the sense amplifier to an intermediate potential between the first and second potentials.

Upon operation, when the sense amplifier is activated in response to the first control signal, the first tri-state inverter is also activated. In this event, the sense amplifier would output a signal at a level corresponding to the potential difference of the input/output line pair, and that signal is inverted and amplified by the first tri-state inverter.

The output signal of the first tri-state inverter is latched by the latch circuit. The signal latched by the latch circuit is inverted and output by the second tri-state inverter.

When the sense amplifier is not activated, that is, before the sense amplifier is activated, the output node of the sense amplifier is precharged to an intermediate potential between the first and second potentials by the precharging circuit.

Accordingly, when readout of data is performed successively and the sense amplifier is activated upon the reading of data after a certain data reading, the output node of the sense amplifier has been precharged to the intermediate potential by the precharging circuit. As a result, the level of the signal output from the sense amplifier would be changed within a short time period in both cases where it is changed to the side of the first potential and where it is changed to the side of the second potential. Accordingly, the access is achieved faster.

In addition, since the output signal of sense amplifier is changed from the intermediate potential, the amplitude of the signal input to the first tri-state inverter is small. Therefore, in the first tri-state inverter, input signal reaches the logical threshold value faster.

Accordingly, since the logic of the output signal from the first tri-state inverter is changed at an earlier timing, delay of access upon the logical change at the first tri-state inverter will be prevented.

Furthermore, regardless of the relationship between the level of a certain read out data and the level of the data which is read immediately after the certain read out data, the access time for the latter data would be constant, since the change in the output signal from the activated sense amplifier starts from the level of the intermediate potential.

When the operation described above is performed, the following effects are obtained. If the sense amplifier is not activated, the operation of the precharge circuit will precharge the output node of the sense amplifier to the intermediate potential. Accordingly, in the reading of the data immediately after a certain data is read out, the change in the level of the output signal from the activated sense amplifier would occur starting from the intermediate potential to attain a prescribed high potential or low potential, so that this level would attain the prescribed high potential or low potential within a short time period. Accordingly, when the data are read successively, each access is made faster.

Furthermore, since the change of the output signal of the sense amplifier starts from the intermediate potential, the signal input to the first tri-state inverter has a small amplitude. Therefore, in the first tri-state inverter, the input signal would reach the logical threshold value within a short time period so that the delay of access upon the logical change at the first tri-state inverter would be prevented.

In addition, regardless of the relationship between the level of a certain read out data and the level of the data read out immediately after the certain read out data, the access time for the latter data would be constant since the change in the output signal of the sense amplifier starts from the intermediate potential, so that lack of balance between the access times of the successive reading operations can be suppressed.

Also, by precharging the output node of the sense amplifier to the intermediate potential by the precharging circuit, the level at the output node of the sense amplifier is changed. At this time, however, the level of the signal output from the second tri-state inverter is not varied even when such a change in level occurs, since the output signal of the second tri-state inverter is latched by the latch circuit. As a result, the operation of the circuit can be stabilized.

The data reading circuit in accordance with another aspect of the present invention operates in response to provision of supply voltage defined by first and second potentials and reads the data conducted from a memory cell to an input/output line pair, and includes a sense amplifier, a first tri-state inverter, a latch circuit, a second tri-state inverter and an MOS transistor.

The sense amplifier receives a first control signal, is activated in response to that first control signal, senses and amplifies the potential difference produced at the input/output line pair corresponding to the data conducted from the memory cell, and outputs a signal of a level corresponding to that potential difference. The first tri-state inverter is activated when the sense amplifier is activated, and inverts, amplifies, and outputs the signal output from the sense amplifier.

The latch circuit latches the signal output from the first tri-state inverter.

The second tri-state inverter receives a second control signal, is activated in response to the second control signal, inverts the signal latched at the latch circuit, and outputs the inverted signal.

The MOS transistor is provided between an output node of the sense amplifier and an output node of the first tri-state inverter, and is made conductive when the sense amplifier is not activated.

Upon operation, when sense amplifier is activated in response to the first control signal, the first tri-state inverter is also activated. In this case, the sense amplifier outputs a signal at a level corresponding to the potential difference of the input/output line pair, and that signal is inverted and amplified by the first tri-state inverter.

The output signal of the first tri-state inverter is latched by the latch circuit. The signal latched by the latch circuit is inverted and output by the second tri-state inverter.

When sense amplifier is not activated, that is, before the activation of the sense amplifier, the MOS transistor is rendered conductive. Thus, the potential at output node of the first tri-state inverter is supplied to the output node of the sense amplifier through the MOS transistor.

In this case, the potential supplied from MOS transistor to the output node of the sense amplifier is obtained by increasing or decreasing the potential at output node of the first tri-state inverter by the amount of the threshold voltage of the MOS transistor. In other words, the output node of the sense amplifier is supplied with an intermediate potential between the first and second potentials.

Thus, before the activation of the sense amplifier, the potential at the output node of the sense amplifier is precharged to the intermediate potential between the first and second potentials.

Accordingly, when the sense amplifier is activated in the reading of a data immediately after a certain data reading is performed, the output node of the sense amplifier is precharged to the intermediate potential. Thus, regardless of whether a level of the signal output from the sense amplifier is changed to the side of the first potential or second potential, the level of the signal is changed within a short time period. Accordingly, the access is made faster.

In addition, the signal input to the first tri-state inverter has a small amplitude since the output signal of the sense amplifier is changed starting from the intermediate potential. Accordingly, in the first tri-state inverter, the input signal reaches the logical threshold value at an earlier timing.

Therefore, since the change in the logic of the output signal from the first tri-state inverter occurs at an earlier timing, the delay access upon the logical change at the first tri-state inverter can be prevented.

Furthermore, regardless of the relationship between the level of a certain read out data and the level of the data read out immediately after the certain read out data, the access time for the latter data will be constant, since the change of the output signal from the activated sense amplifier starts at the level of the intermediate potential.

Owing to such operations, the following effects are obtained. When the sense amplifier is not activated, the MOS transistor is rendered conductive. Through this transistor, the potential of the output node of the first tri-state inverter is supplied to the output node of the sense amplifier, thereby precharging the output node of the sense amplifier to the intermediate potential.

Accordingly, when the level of the output signal from the activated sense amplifier is changed in the reading of a data immediately after a certain read out data, that level is changed from the intermediate potential to a prescribed high potential or low potential so that the level would reach the prescribed high potential or low potential within a short time period. Accordingly, when data is read continuously, each access can be made faster.

In addition, the signal input to the first tri-state inverter has a small amplitude since the change of the output signal from the sense amplifier starts from the intermediate potential. Therefore, in the first tri-state inverter, the time required for the input signal to reach the logical threshold value is short so that delay of access upon the logical change at the first tri-state inverter can be prevented.

Furthermore, regardless of the relationship between the level of a certain read out data and the level of the data read out immediately after the certain read out data, the access time for the latter data would be constant, since the change of the output signal from the sense amplifier starts from the intermediate potential. As a result, the lack of balance between the access times in a successive reading operation can be suppressed.

Also, the level of the output node of the sense amplifier is changed by precharging the output node of the sense amplifier to the intermediate potential by operation of the MOS transistor. At this time, however, the signal output from the second tri-state inverter would not change its level even when the level of the output node of the sense amplifier is thus changed, since the output signal of the second tri-state inverter is latched by the latch circuit. As a result, the operation of the circuit can be stabilized.

The data reading circuit in accordance with yet another aspect of the present invention operates in response to provision of supply voltage defined by first and second potentials, is for reading the data conducted from a memory cell to an input/output line pair, and includes a sense amplifier, a first tri-state inverter, a latch circuit, a second tri-state inverter and a third tri-state inverter.

The sense amplifier receives a first control signal, is activated in response to that first control signal, senses and amplifies the potential difference produced at the input/output line pair corresponding to the data conducted from the memory cell, and outputs a signal at a level corresponding to that potential difference.

The first tri-state inverter is activated when the sense amplifier is activated, and inverts, amplifies, and then outputs the signal output from the sense amplifier.

The latch circuit latches the signal output from the first tri-state inverter.

The second tri-state inverter receives a second control signal, is activated in response to that second control signal, inverts the signal latched by the latch circuit, and outputs the inverted signal.

The third tri-state inverter has both of its input terminal and output terminal connected to the output node of the sense amplifier, and is activated when the sense amplifier is not activated.

Upon operation, when the sense amplifier is activated in response to the first control signal, the first tri-state inverter is also activated. In this case, the sense amplifier will output a signal having a level corresponding to the potential difference of input/output line pair, and that signal is inverted and amplified by the first tri-state inverter.

The output signal from the first tri-state inverter is latched by the latch circuit. The signal latched by the latch circuit is inverted and then output by the second tri-state inverter.

When the sense amplifier is not activated, that is, before the activation of the sense amplifier, the third tri-state inverter is activated. The third tri-state inverter has both of its input terminal and output terminal connected to the output node of the sense amplifier so that when activated, it supplies an intermediate potential between the first and second potential to the output node of the sense amplifier.

Accordingly, the potential at the output node of the sense amplifier is precharged to the intermediate potential between the first and second potentials before the activation of the sense amplifier.

Therefore, the output node of the sense amplifier is precharged to an intermediate potential by the precharging circuit when the sense amplifier is activated in the reading of the data following a certain read out data. Accordingly, whether the level of the signal output from the sense amplifier changes to the side of first potential or the side of the second potential, the level of that signal would be changed within a short time period. Therefore, a faster access is achieved.

The signal input to the first tri-state inverter has a small amplitude since the change of the output signal of the sense amplifier starts from the intermediate potential. Accordingly, the input signal reaches the logical threshold value at an earlier timing.

Accordingly, since the change in the logic of the output signal from the first tri-state inverter occurs at an earlier timing, the delay of access upon the logical change at the first tri-state inverter can be prevented.

In addition, regardless of the relationship between the level of a certain read out data and the level of the data read out immediately after the certain read out data, the access time for the latter data would be constant, since the change of the output signal from the activated sense amplifier starts from the intermediate potential.

By such operations, the following effects are obtained. When the sense amplifier is not activated, the third tri-state inverter is activated. An inverted version of the potential of the output node of the sense amplifier is supplied to the output node of the sense amplifier, thereby precharging the output node of the sense amplifier to the intermediate potential.

Thus, when there is a change in level of the output signal from the activated sense amplifier upon reading of a data immediately following a certain read out data, that level is changed from the intermediate potential to a prescribed high potential or low potential so that this level would reach the prescribed high potential or low potential within a short time period. Accordingly, each access when the data is read successively can be made faster.

Also, the signal input to the first tri-state inverter has a small amplitude because the change in the output signal from the sense amplifier starts from the intermediate potential. Accordingly, in the first tri-state inverter, the time period required for the input signal to reach the logical threshold value is short. Thus, the delay of access upon the logical change at the first tri-state inverter can be prevented.

Furthermore, regardless of the relationship between the level of a certain read out data and a level of data read out immediately after the certain read out data, the access time for the latter data would be constant, since the change in the output signal from the sense amplifier starts from the intermediate potential. As a result, the lack of balance in the access times of the successive reading operation can be suppressed.

In addition, by precharging the output node of the sense amplifier to the intermediate potential due to the operation of the third tri-state inverter, there would be a change in the level of the output node of the sense amplifier. At this time, however, even when there is such a change in the output node of the sense amplifier, the level of the signal output from the second tri-state inverter would not change since the output signal of the second tri-state inverter is latched by the latch circuit. As a result, the operation of the circuit can be stabilized.

A data reading circuit in accordance with yet another aspect of the present invention operates in response to provision of supply voltage defined by a first potential and a second potential lower than this first potential so as to read the data conducted from a memory cell to an input/output line pair, and includes a sense amplifier, a first tri-state inverter, a latch circuit, a second tri-state inverter, a first potential node, a second potential node, a connection node, a PMOS transistor and an NMOS transistor.

The sense amplifier receives a first control signal, is activated in response to that first control signal, senses and amplifies the potential difference produced at the input/output line pair corresponding to the data transmitted from the memory cell, and outputs a signal at a level corresponding to that potential difference.

The first tri-state inverter is activated when the sense amplifier is activated, and inverts, amplifies and then outputs the signal output from the sense amplifier. The latch circuit latches the signal output from the first tri-state inverter.

The second tri-state inverter receives a second control signal, is activated in response to that second control signal, and inverts the signal latched by latch circuit and outputs the inverted signal.

The first potential node receives a first potential. The second potential node receives a second potential. The connection node is connected to the output node of the sense amplifier.

PMOS transistor is connected between the first potential node and the connection node, and is rendered conductive when the sense amplifier is not activated. NMOS transistor is connected between the connection node and the second potential node, and is rendered conductive when the sense amplifier is not activated.

Upon operation, when the sense amplifier is activated in response to the first control signal, the first tri-state inverter is also activated. In this event, the sense amplifier will output a signal at a level corresponding to the potential difference of the input/output line pair and that signal is inverted and amplified by the first tri-state inverter.

The output signal from the first tri-state inverter is latched by the latch circuit. The signal latched by a latch circuit is inverted and then output by the second tri-state inverter.

When the sense amplifier is not activated, that is, before the activation of the sense amplifier, both of the PMOS transistor and NMOS transistor is made conductive. As a result, the connection node would be at an intermediate potential between the first and the second potentials owing to the on-resistance of the respective PMOS transistor and NMOS transistor.

Accordingly, the output node of the sense amplifier is supplied with the intermediate potential. As a result, potential of the output node of the sense amplifier is precharged to the intermediate potential between the first and second potentials before activation of the sense amplifier.

Therefore, in the reading of the data immediately after a certain readout of data, the output node of the sense amplifier is precharged to the intermediate potential by the precharging circuit at the time of activation of the sense amplifier. Thus, whether the level of the signal output from the sense amplifier is changed to the side of the first potential or the second potential, it is changed within a short time period. Accordingly, a faster access is achieved.

In addition, since the change of the output signal from the sense amplifier starts from the intermediate potential, the signal input to the first tri-state inverter has a small amplitude. Accordingly, in the first tri-state inverter, the input signal reaches the logical threshold value at an earlier timing.

Since the change of the logic of the output signal from the first tri-state inverter occurs at an earlier timing, delay of access upon the logical change at the first tri-state inverter is prevented.

In addition, regardless of the relationship between the level of a certain read out data and the level of the data read out immediately after the certain read out data, the access time for the latter data would be constant, since the change in the output signal of the activated sense amplifier starts from an intermediate potential.

The above-described operations would provide the following effects. When the sense amplifier is not activated, PMOS transistor and NMOS transistor is rendered conductive, and the on-resistance of these transistors would generate an intermediate potential which is supplied to the output node of the sense amplifier, so that the output node of the sense amplifier is precharged to the intermediate potential.

As a result, when the level of the output signal of the activated sense amplifier is changed in the reading of a data immediately after a certain data reading, this change would occur from the intermediate potential to a prescribed high potential or low potential, so that this level would attain the prescribed high potential or low potential within a short time period. Accordingly, when data is read successively, each access can be made faster.

Since the change of the output signal of the sense amplifier starts from the intermediate potential, the signal input to the first tri-state inverter has a small amplitude. Accordingly, in the first tri-state inverter, the time required for the input signal to reach the logical threshold value is short so that the delay of access upon the logical change at the first tri-state inverter can be prevented.

Regardless of the relationship between the level of a certain read out data and the level of the data read out immediately after the certain read out data, the access time for the latter data would be constant, since the change of the output signal of the sense amplifier starts from the intermediate potential. As a result, the lack of balance between the access times in the successive reading operation can be suppressed.

Furthermore, by precharging the output node of the sense amplifier to the intermediate potential by the operation of PMOS transistor and NMOS transistor, the level of the output node of the sense amplifier is changed. At this time, however, even when there is such a change in the level of the output node of the sense amplifier, the level of the signal output from the second tri-state inverter would not change since the output signal from the second tri-state inverter is latched by the latch circuit. As a result, the operation of the circuit can be stabilized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments according to the present invention will be described in detail hereinbelow, with reference to the figures.

First Embodiment

Figure 1:
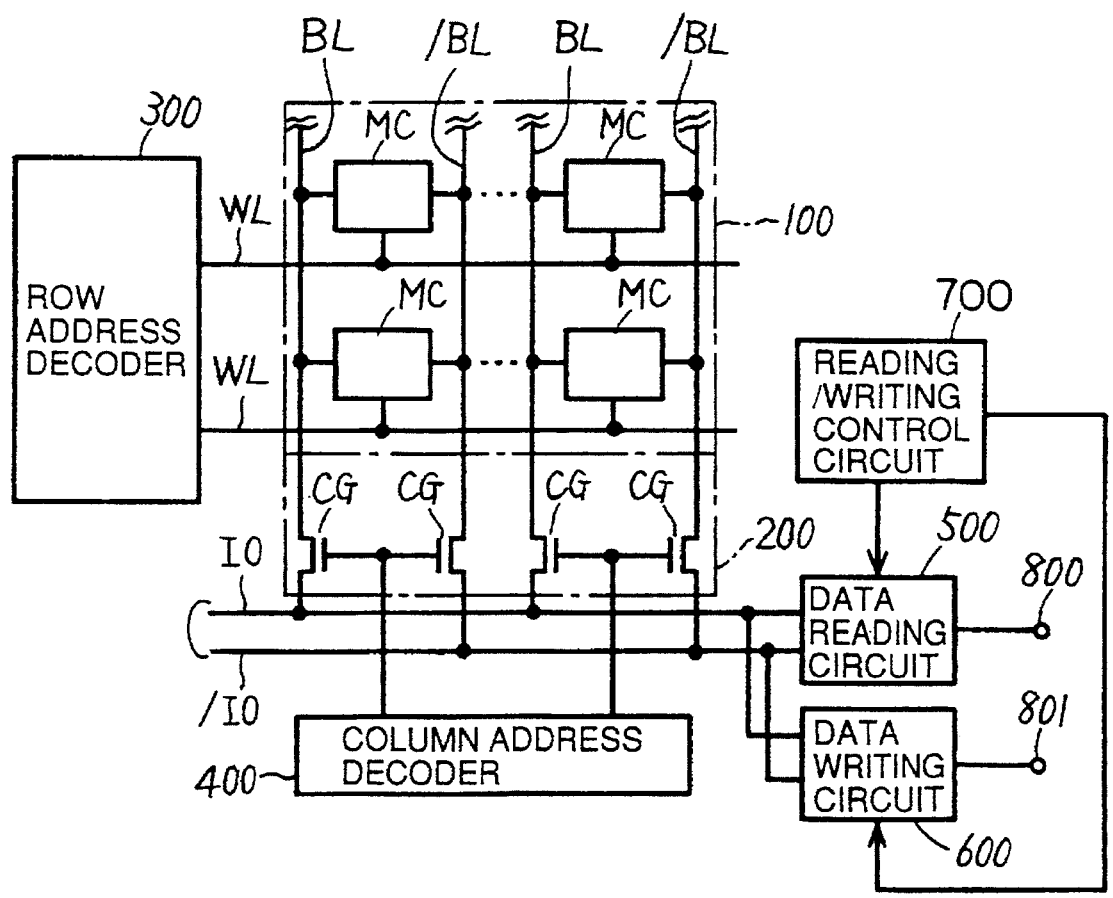
FIG. 1 is a block diagram showing a structure of a semiconductor memory device in accordance with one embodiment of the present invention.

FIG. 1 is a block diagram showing a structure of a semiconductor memory device according to one embodiment of the present invention. Referring to FIG. 1, this semiconductor memory device includes a memory cell array 100, a multiplexer 200, a row address decoder 300, a column address decoder 400, an input/output line pair IO, $\overline{IO}$, a data reading circuit 500, a data writing circuit 600, a reading/writing control circuit 700, an input pin 801 and an output pin 800.

Memory cell array 100 includes a plurality of word lines WL, WL ..., a plurality of bit line pairs BL and $\overline{BL}$, BL and $\overline{BL}$ ..., as well as a plurality of memory cells MC ....

In memory cell array 100, memory cells MC are placed at the respective intersections of a plurality of word lines WL, WL ... and a plurality of bit line pairs BL and $\overline{BL}$, BL and $\overline{BL}$ .... Thus, a plurality of memory cells MC are placed at the rows and columns.

Multiplexer 200 includes column selecting gates formed of NMOS transistors provided corresponding to the plurality of bit line pairs BL, $\overline{BL}$ ..., respectively. Plurality of bit line pairs BL and $\overline{BL}$ ... are connected to input/output line pair IO and $\overline{IO}$ through corresponding column selecting gates CG, CG ..., respectively.

Row address decoder 300 performs selective activation of the word lines WL corresponding to the input row address signals. Column address decoder 400 renders a pair of column selecting gates CG and CG conductive depending on the input column address signal, and selects a pair of bit lines BL and $\overline{BL}$.

Access is performed on the memory cell connected to word line WL and bit line pair BL and $\overline{BL}$ selected respectively by row address decoder 300 and column address decoder 400.

Data reading circuit 500 and data writing circuit 600 are connected to input/output line pair IO and $\overline{IO}$. Also, data reading circuit 500 is connected to output pin 800 and data writing circuit 600 is connected to input/output pin 801.

Reading/writing control circuit 700 is a circuit for controlling data reading circuit 500 and data writing circuit 600. In order to provide this control, it supplies a control signal to each of data reading circuit 500 and data writing circuit 600.

Operation of the semiconductor memory device shown in FIG. 1 will now be described in brief.

When data writing operation is performed, data which is input from input pin 801 is conducted to input/output line pair IO and $\overline{IO}$ via data reading circuit 600. A potential difference corresponding to the conducted data is produced at input/output line pair IO and $\overline{IO}$. The data conducted to input/output line pair IO and $\overline{IO}$ is written into selected memory cell MC via column selecting gates CG, CG and bit line pair BL, $\overline{BL}$.

In data reading operation, the data written into the selected memory cell MC is conducted to corresponding bit line pair BL, $\overline{BL}$ and to input/output line pair IO, $\overline{IO}$ through column selecting gates CG, CG. This produces a potential difference corresponding to the conducted data at input/output line pair IO and $\overline{IO}$. The data conducted to input/output line pair IO and $\overline{IO}$ is supplied to output pin 800 via data reading circuit 500 so as to be output externally.

Data reading circuit 500 shown in FIG. 1 will now be described in detail.

Figure 2:
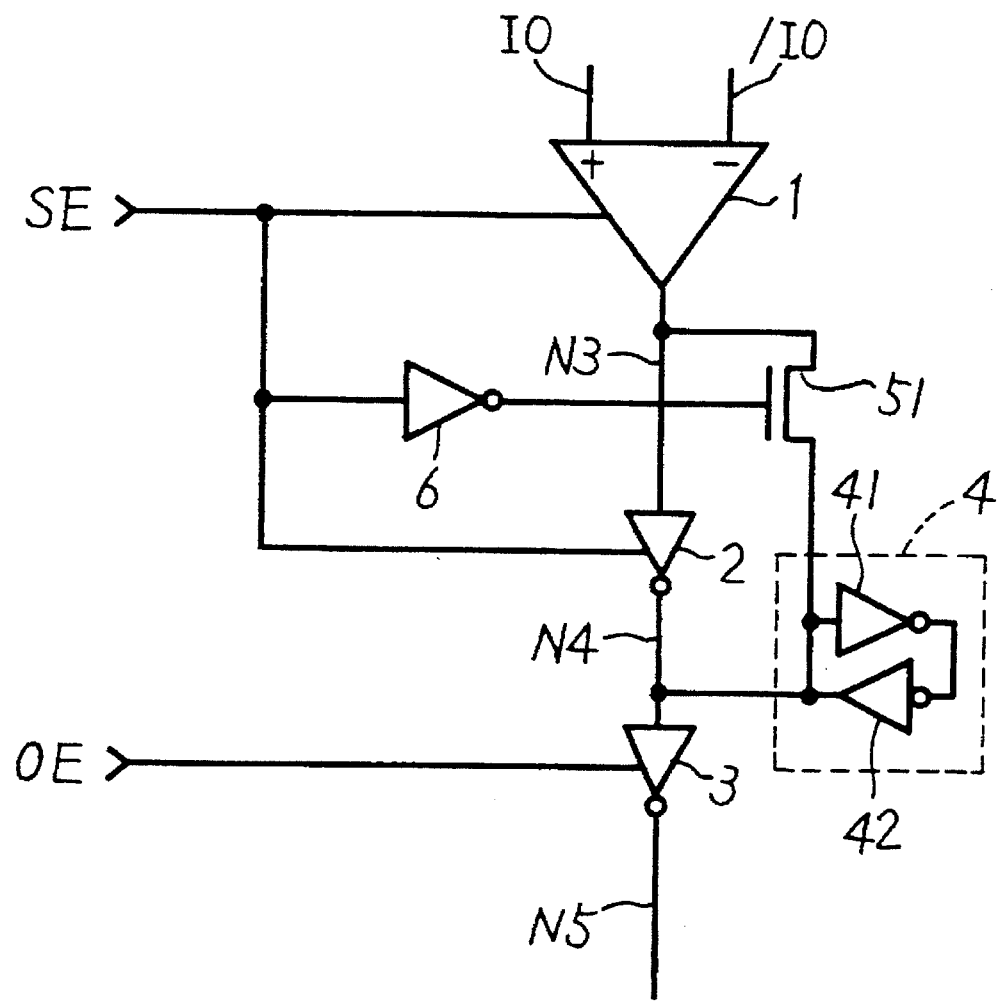
FIG. 2 is a schematic diagram showing a data reading circuit in accordance with a first embodiment.

FIG. 2 is a schematic diagram showing the data reading circuit according to the first embodiment. Components in FIG. 2 which are common to the data reading circuit of FIG. 7 are denoted by identical reference characters and description thereof is not given.

Referring to FIG. 2, this data reading circuit includes a sense amplifier 1, tri-state inverters 2 and 3, a static latch circuit 4, an inverter 6 and an N channel MOS transistor (hereinafter referred to as NMOS transistor) 51. In addition, static latch circuit 4 includes two inverters 41 and 42.

Figure 7:
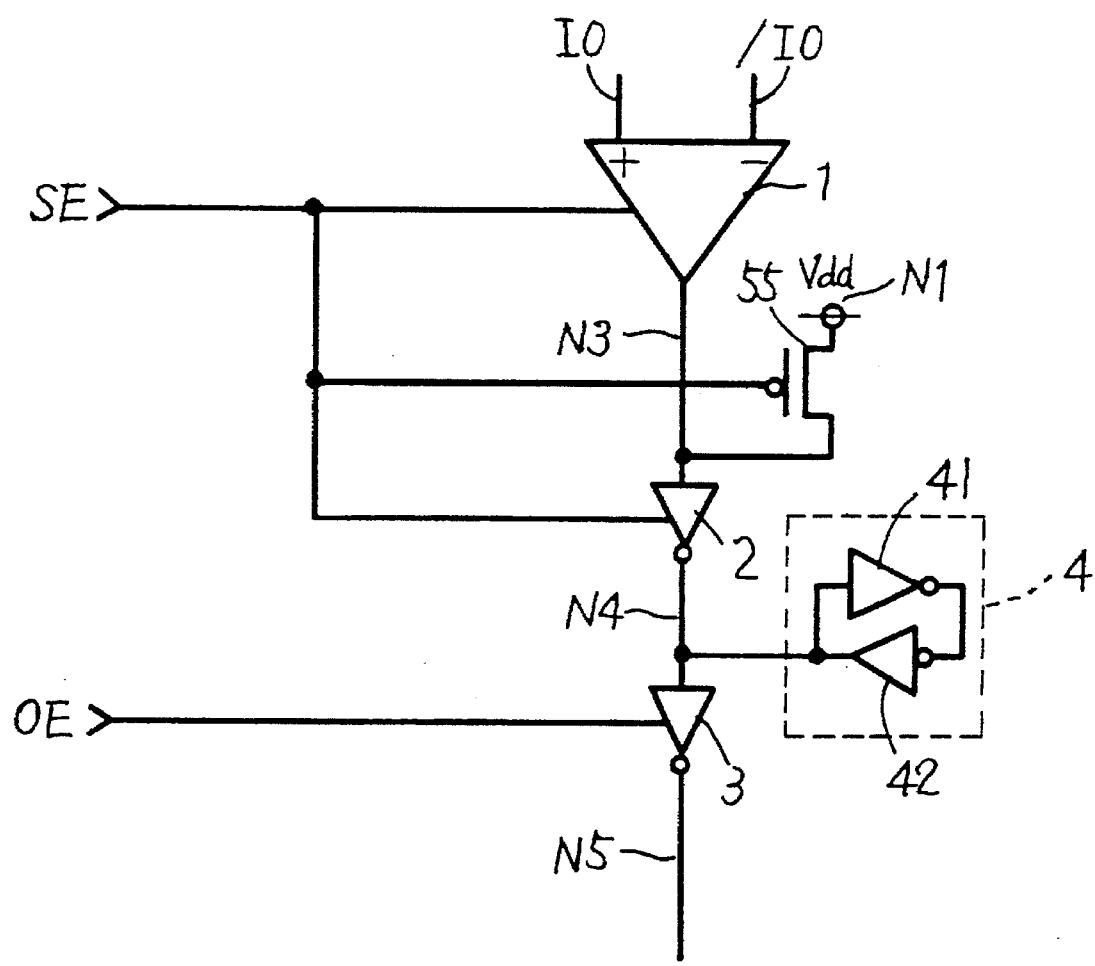
FIG. 7 is a schematic diagram showing a conventional data reading circuit.

This data reading circuit of FIG. 2 differs from that of FIG. 7 in that it is not provided with a PMOS transistor 55. Instead, inverter 6 and NMOS transistor 51 are provided.

NMOS transistor 51 is a transistor for precharging, which is connected between a node N4 and a node N3. Inverter 6 inverts a sense enable signal SE and outputs the inverted signal. This sense enable signal SE is supplied from writing/reading control circuit 700. To the gate electrode of NMOS transistor 51, the inverted signal of sense enable signal SE is supplied from inverter 6.

Operation of the data reading circuit shown in FIG. 2 will now be described. Here, description will be made mainly on the operation which differs from that of the data reading circuit of FIG. 7.

When sense enable signal SE is at L level, sense amplifier 1 and tri-state inverter 2 are both inactive. At the same time, NMOS transistor 51 is rendered conductive.

Accordingly, potential at node N4 which, in this case, is an inverted version of the potential of node N3 is supplied to node N3 through NMOS transistor 51. The level of this potential supplied to node N3 is obtained by raising or lowering the potential of node N4 by the threshold voltage of NMOS transistor 51. In other words, node N3 is supplied with a potential intermediate between the power supply potential and the ground potential.

Thus, the potential of node N3 is precharged to attain an intermediate potential between the power supply potential and the ground potential (that is, ½ Vdd where the power supply potential is represented by Vdd). Accordingly, precharging operation is performed when the sense enable signal is at L level.

Even when the precharging operation as described above is performed, the potential at node N4 is retained by static latch circuit 4 so that it is maintained stable.

As described above, in the data reading circuit of FIG. 2, NMOS transistor 51 constitutes a portion of a circuit for precharging. Precharging is effected through a signal path of tri-state inverter 2, static latch circuit 4 and NMOS transistor 51.

Meanwhile, when the sense enable signal SE is at H level, sense amplifier 1 and tri-state inverter 2 are made active. At the same time, NMOS transistor 51 is rendered non-conductive. Accordingly, sense amplifier 1 performs a sensing operation. Then, the output signal from the sense amplifier 1 is inverted by tri-state inverter 2 and is output to node N4.

When tri-state inverter 3 is activated in response to an output enable signal OE supplied externally, the potential at node N4 which is latched by static latch circuit 4 is inverted and is supplied to node N5.

Therefore, when sense enable signal SE is at H level, sensing operation is performed so that data is read out.

Figure 3:
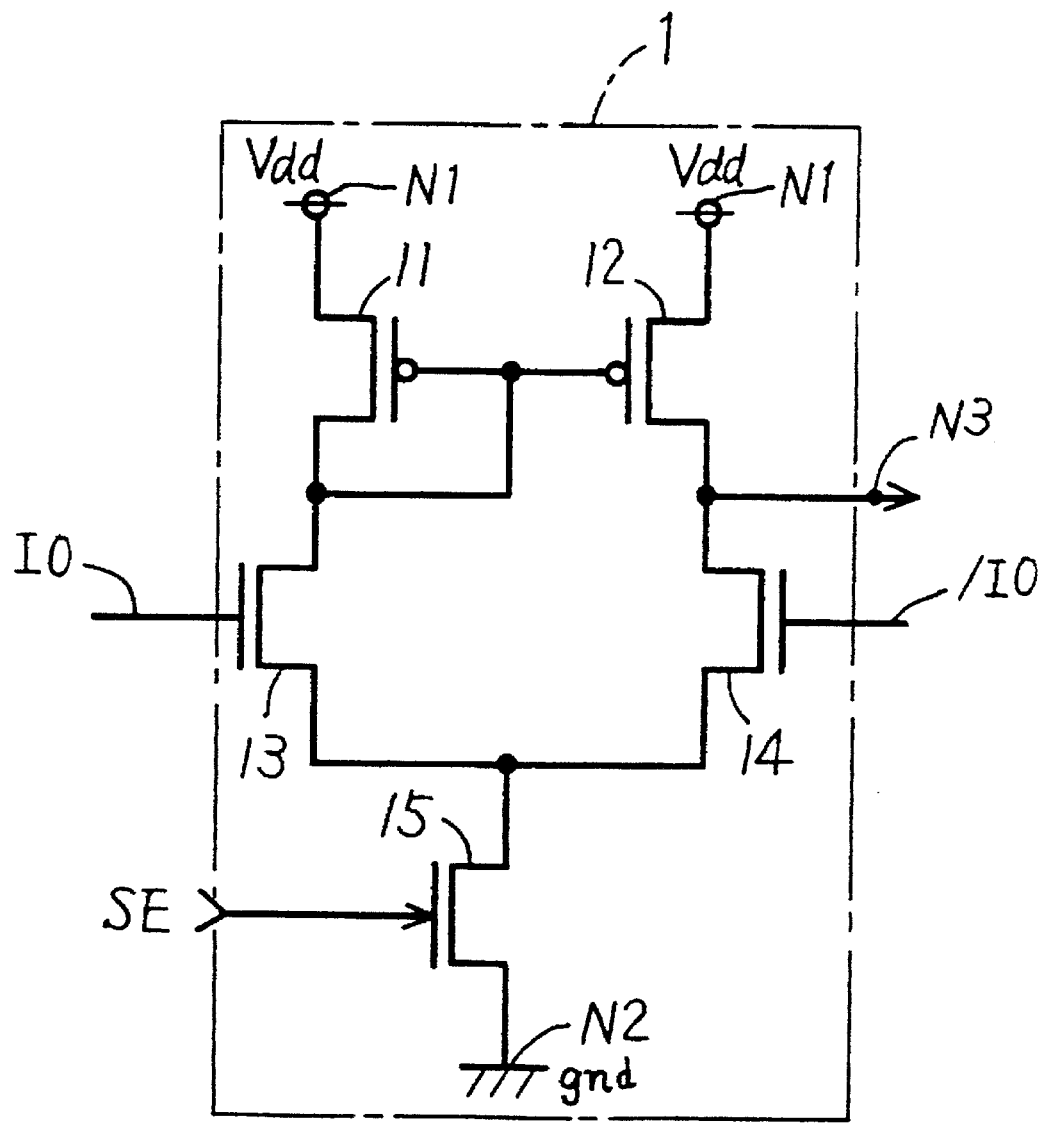
FIG. 3 is a circuit diagram showing an example of a structure for a sense amplifier of FIG. 2.

An example of sense amplifier 1 will now be described. FIG. 3 is a circuit diagram showing one example of the structure of sense amplifier 1 shown in FIG. 2. Referring to FIG. 3, this sense amplifier 1 includes PMOS transistors 11 and 12, as well as NMOS transistors 13, 14 and 15.

Both of transistors 11 and 12 have their source electrodes connected to power supply node N1 which receives power supply potential Vdd. Gate electrodes of both transistors 11 and 12 are connected to the drain electrode of transistor 11.

Transistors 11 and 13 has their drain electrodes connected to one another. Transistor 13 has its gate electrode in connection with one input/output line IO. Transistors 12 and 14 has their drain electrodes connected to one another. Transistor 14 has its gate electrode in connection with the other input/output line $\overline{IO}$. The connection node between transistors 12 and 14 is connected to node N3.

Transistor 15 has its source electrode connected to a ground node N2 which receives the ground potential gnd (0 V), and its drain electrode connected to respective source electrodes of transistors 13 and 14. The gate electrode of transistor 15 is supplied with sense enable signal SE.

Operation of sense amplifier 1 will now be described.

When sense enable signal SE is at L level, transistor 15 is made non-conductive. As a result, node N3 is separated from ground node N2, regardless of whether transistors 13 and 14 are conductive or non-conductive. In this case, drain and gate electrodes of transistor 11 would have a potential which is lower than power supply potential Vdd by the amount of the threshold voltage. This is because transistor 11 is diode-connected.

Transistor 12 has its gate electrode connected with the gate electrode of transistor 11. Accordingly, the drain potential of transistor 12 would be the same as the gate potential of transistor 11. Thus, such potential would be the potential of node N3. This state of output is called high impedance state.

Meanwhile, when sense enable signal SE is at H level (that is, the level of Vdd), transistor 15 is rendered conductive. In this case, one of transistors 13 and 14 which receives a potential of H level at its gate electrode would be conductive and the other one which receives the potential of L level (that is, the level of gnd) would be non-conductive.

In this situation, if transistor 13 is rendered conductive, the gate potential of transistor 12 is lowered so that transistor 12 is rendered conductive. Accordingly, the potential at node N3 attains H level (Vdd). On the contrary, if transistor 14 is rendered conductive, node N3 and ground node N2 are connected to one another so that the potential of node N3 would be at L level (gnd).

Therefore, when sense enable signal SE is at H level, the potential of node N3 is turned to either H level or L level.

Operation in which two data are read successively in the data reading circuit of FIG. 2 will now be described.

As in the description of the conventional example, there are four types of operating states in successive reading operations. In the first successive reading operation, data are read in the order of H level-H level. In the second successive reading operation, data are read in the order of H level-L level. In the third successive reading operation, data are read in the order of L level-L level. In the fourth successive reading operation, data are read in the order of L level-H level.

Figure 4:
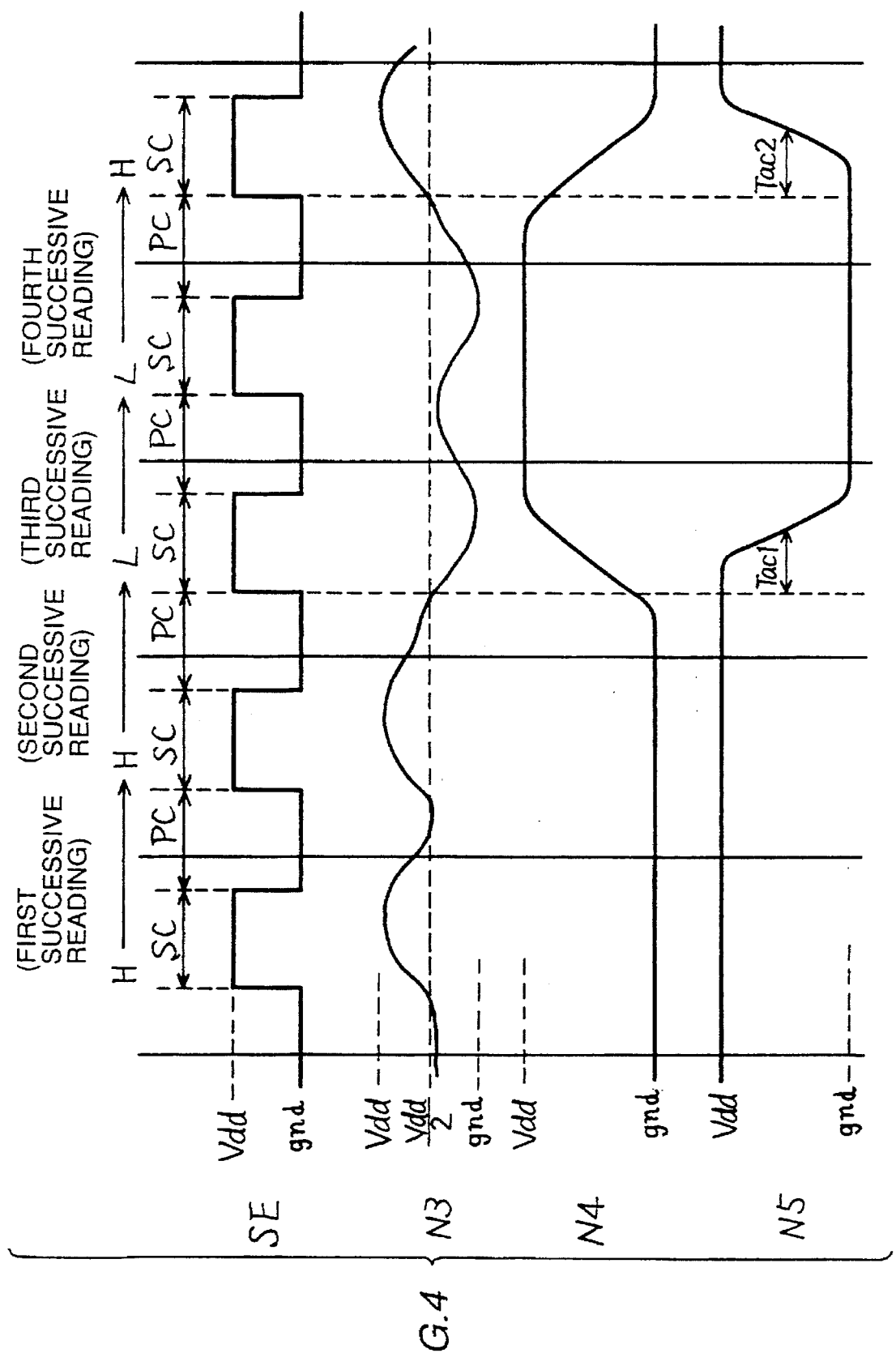
FIG. 4 is a timing chart for successive reading operations in the data reading circuit shown in FIG. 2.

FIG. 4 is a timing chart for the successive reading operations in the data reading circuit of FIG. 2. This FIG. 4 shows an example in which the first to fourth successive reading operations are performed continuously.

In addition, the levels of sense enable signal SE as well as signal levels at node N3, node N4 and node N5, respectively, in the successive reading operation are shown in this FIG. 4. In the situation shown in this FIG. 4, output enable signal OE is always fixed at H level.

Description is made first on the first successive reading operation. Here, data at H level is read first in an initial sense cycle (the cycle in which sensing operation is performed) SC. Then, in a precharge cycle (a cycle in which precharging operation is performed) PC, node N3 is precharged to an intermediate potential (½ Vdd), and data at H level is read in the following sense cycle SC.

In this situation, potential at node N3 is varied since data at H level is read after the precharging to attain the intermediate potential. However, the potential at node N5 is not changed since the read data is at the same level as the data read in the previous sense cycle SC. Accordingly, there is no delay in the access performed in the first successive reading operation.

Description is now made for the second successive reading operation. Here, data at H level is read first in an initial sense cycle SC. Then, in precharge cycle PC, node N3 is precharged to the level of the intermediate potential, and data at L level is read in the following sense cycle SC.

Figure 8:
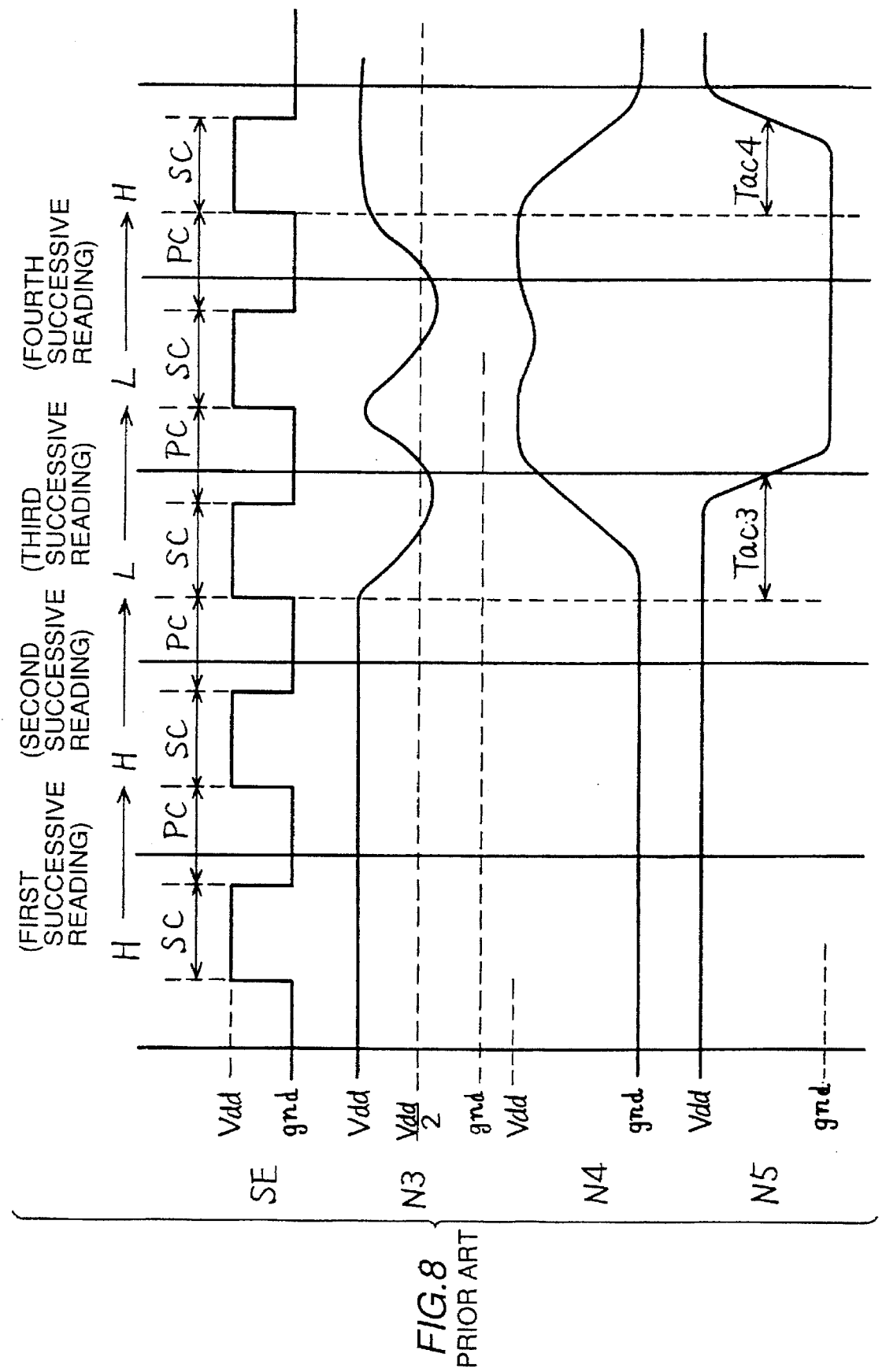
FIG. 8 is a timing chart for successive reading operations in the data reading circuit of FIG. 7.

Since reading of L level data is initiated from the point where node N3 is at the intermediate potential, the potential of node N3 would attain L level within a shorter time period as compared to the conventional example. Accordingly, the access time Tac1 shown here is made shorter than in the conventional access time Tac3 shown in FIG. 8.

Furthermore, the time required for the potential at node N3 which is the input potential to reach the level of logical threshold value is reduced in the operation of the tri-state inverter 2 of this example. Thus, the access in this second successive reading operation is made still faster as compared to the conventional example.

Description is now made on the third successive reading operation. Data at L level is read first in an initial sense cycle SC. Thereafter, node N3 is precharged to attain the level of the intermediate potential in a precharge cycle PC, and data at L level is read in the following sense cycle SC.

The potential at node N3 is changed since L level is read after the precharging of node N3 to attain the intermediate potential. However, since the read data is at the same level as the data read in the previous sense cycle, the potential at node N5 is not changed. Accordingly, there is no delay in the access time upon the third successive reading operation.

Description is now made for the fourth successive reading operation. Data at L level is read first in an initial sense cycle SC. Thereafter, node N3 is precharged to attain the level of intermediate potential at a precharge cycle PC, and data at H level is read in the following sense cycle SC.

Since reading of H level data is initiated from the point where node N3 is at the intermediate potential, the potential of node N3 reaches L level within a short time. Accordingly, access time Tac2 is not as long as the access time in the conventional example, also in this fourth successive reading operation.

Effects obtained by the data reading circuit according to this first embodiment will be described next.

As described, in the data reading circuit of FIG. 2, delay of access can be prevented time in the successive reading operations of all types by precharging node N3 at the output side of sense amplifier 1 to an intermediate potential during the precharge cycle. In other words, access is made faster in all types of successive reading operations in the data reading circuit of FIG. 2.

In addition, in the data reading circuit of FIG. 2, there is no change in the level of node N4 which has been the unstable operation caused in the third successive reading operation of the conventional data reading circuit. This is because the time required for the potential at node N3 to reach the logical threshold value of tri-state inverter 2 is reduced.

Furthermore, in the data reading circuit of FIG. 2, the lack of balance between access time Tac1 of the second successive reading operation and access time Tac1 of the fourth successive reading operation which has been caused in the conventional data reading circuit can also be eliminated.

Second Embodiment

Description is now made on the second embodiment. In this second embodiment, another example will be described in which precharging of node N3 at the output side of sense amplifier 1 to attain intermediate potential is possible.

Figure 5:
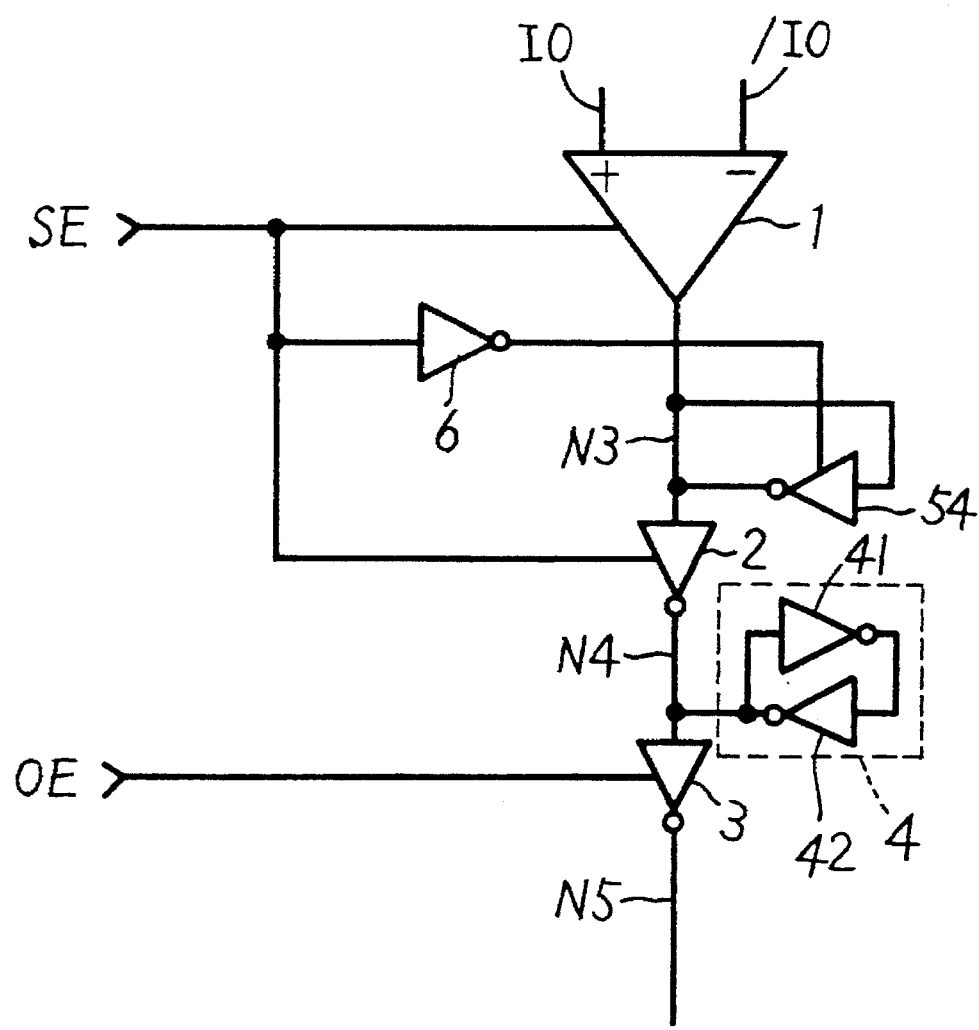
FIG. 5 is a schematic diagram of a data reading circuit in accordance with a second embodiment.

FIG. 5 is a schematic diagram showing the data reading circuit in accordance with the second embodiment. Components of this data reading circuit of FIG. 5 which are common to those of the circuit shown in FIG. 2 are denoted by identical reference characters and the description thereof is not given.

The data reading circuit of FIG. 5 differs from that of FIG. 2 in that it is not provided with NMOS transistor 51. Instead, a tri-state inverter 54 is provided. This tri-state inverter 54 is used for precharging, and its input terminal and output terminal are both connected to a node N3.

This tri-state inverter 54 receives an inverted signal of a sense enable signal SE output from an inverter 6 as a control signal. The operating state of tri-state inverter 54 is controlled in response to this control signal.

Description is now made on the operation of the data reading circuit shown in FIG. 5. Here, the operation which differs from that of the data reading circuit shown in FIG. 2 is mainly described.

When sense enable signal SE is at L level, a sense amplifier 1 and a tri-state inverter 2 are both inactivated. At the same time, tri-state inverter 54 is activated. Accordingly, since tri-state inverter 54 has both of its input terminal and output terminal connected to node 3, it supplies potential intermediate between power supply potential Vdd and ground potential gnd to node N3 when activated.

Accordingly, the potential at node N3 is precharged to attain the level of the intermediate potential (½ Vdd) between power supply potential Vdd and ground potential gnd. Thus, when sense enable signal SE is at L level, precharging operation is performed on node N3.

Even when such precharging is effected, a potential at a node N4 remains stable since it is retained by a static latch circuit 4.

Meanwhile, when sense enable signal SE is at H level, sense amplifier 1 and tri-state inverter 2 are activated. At the same time, tri-state inverter 54 is made inactive. As a result, sense amplifier 1 performs sensing operation and its output signal is inverted by tri-state inverter 2 so as to be supplied to node N4.

When tri-state inverter 3 is activated in response to an output enable signal OE, the potential at node N4 which is latched by static latch circuit 4 is inverted by a tri-state inverter 3 so as to be supplied to a node N5.

Accordingly, when sense enable signal SE is at H level, a sensing operation is performed and the data is read out.

In the data reading circuit of this FIG. 5, node N3 is precharged to attain the intermediate potential as in the data reading circuit of FIG. 2. Accordingly, the successive reading operation in data reading circuit of FIG. 5 is similar to that of the circuit shown in FIG. 4. Thus, description thereof is not provided.

Based upon the foregoing, in the data reading circuit of FIG. 5 according to the second embodiment, a precharging operation similar to that of the first embodiment is performed. Accordingly, the same effect as that of data reading circuit of FIG. 2 according to the first embodiment can be obtained.

Third Embodiment

Description is now made on the third embodiment. In this third embodiment, another example in which precharging of node N3 at the output side of sense amplifier 1 is possible so as to attain an intermediate potential is described.

Figure 6:
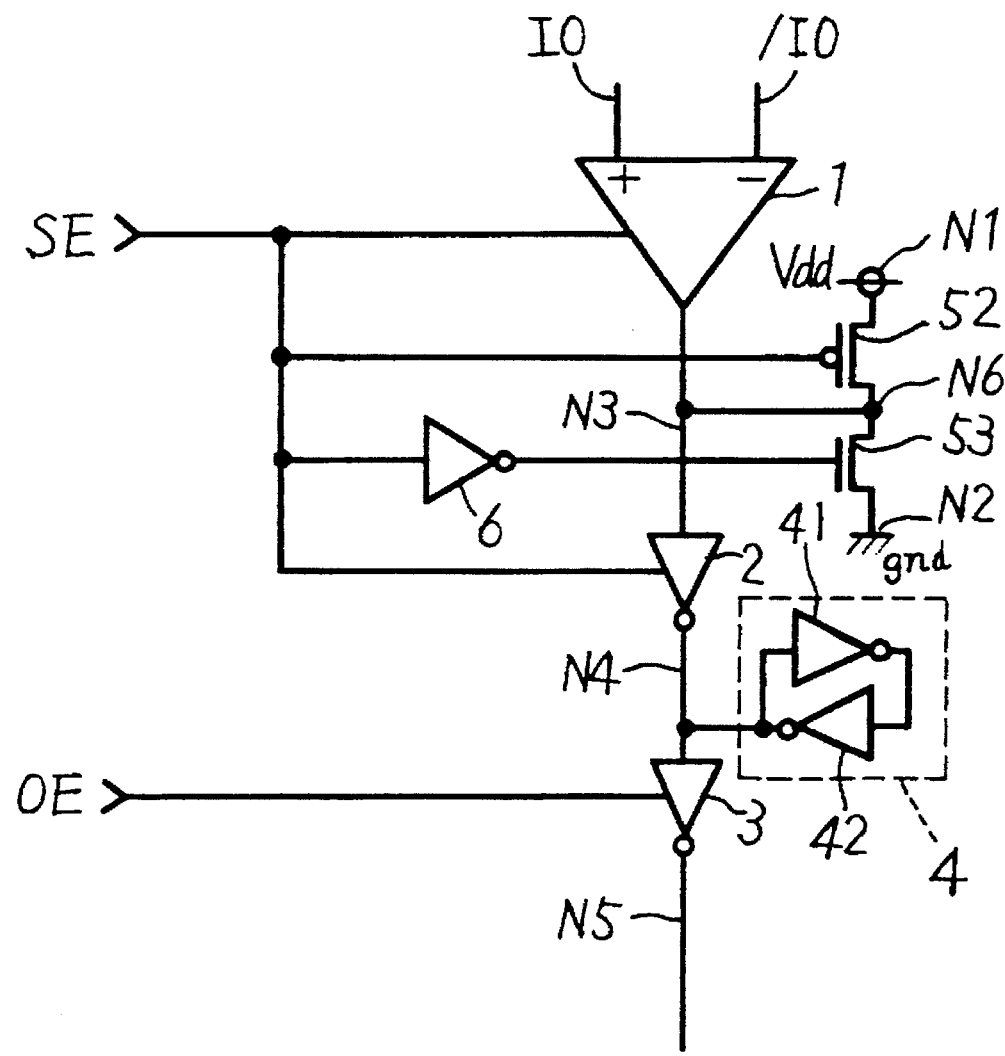
FIG. 6 is a schematic diagram of a data reading circuit in accordance with a third embodiment.

FIG. 6 is a schematic diagram showing a data reading circuit according to the third embodiment. Components shown in FIG. 6 which corresponds to those shown in FIG. 2 are denoted by identical reference characters and description thereof is not provided.

The data reading circuit of FIG. 6 differs from that of FIG. 2 in that it is not provided with NMOS transistor 51. Instead, a PMOS transistor 52 and an NMOS transistor 53 are provided. These transistors 52 and 53 are used for precharging and are connected in series between a power supply node N1 and a ground node N2.

PMOS transistor 52 receives a sense enable signal SE at its gate electrode and operates in response to this signal. NMOS transistor 53 receives an inverted signal of sense enable signal SE output from an inverter 6 at its gate electrode and operates in response to this signal.

A connection node N6 between PMOS transistor 52 and NMOS transistor 53 is in connection with a node N3 at the output side of a sense amplifier 1. Accordingly, the potential of this connection node N6 is supplied to node N3.

Operation of the data reading circuit shown in FIG. 6 will now be described. Here, operation which differs from that of the data reading circuit shown in FIG. 2 is mainly described.

When sense enable signal SE is at L level, sense amplifier 1 and a tri-state inverter 2 are both inactivated. At the same time, sense enable signal SE and its inverted signal render PMOS transistor 52 as well as NMOS transistor 53 conductive.

Here, connection node N6 would be at an intermediate potential (½ Vdd) between power supply potential Vdd and ground potential gnd owing to the on-resistance of each of PMOS transistor 52 and NMOS transistor 53.

Accordingly, since this intermediate potential is supplied to node N3, node N3 is precharged to attain this intermediate potential. Thus, when sense enable signal SE is at L level, precharging operation is performed.

Even when such precharging is effected, the potential of a node N4 remains stable since it is retained by static latch circuit 4.

Thus, in the data reading circuit of FIG. 6, PMOS transistor 52 and NMOS transistor 53 forms a circuit for precharging.

Meanwhile, when sense enable signal SE is at H level, sense amplifier 1 and tri-state inverter 2 would be activated. At the same time, sense enable signal SE and its inverted signal would make PMOS transistor 52 and NMOS transistor 53 non-conductive.

As a result, sense amplifier 1 would perform a sensing operation and its output signal would be inverted by tri-state inverter 2 so as to be supplied to node N4.

Then, if a tri-state inverter 3 is activated in response to an output enable signal OE, potential at node N4 which is latched by static latch circuit 4 is inverted by tri-state inverter 3 so as to be supplied to a node N5.

Accordingly, when sense enable signal SE is at H level, sensing operation is performed and the data is read.

In the data reading circuit of this FIG. 6, node N3 is precharged to be at intermediate potential as in the data reading circuits of FIG. 2 and FIG. 3. Accordingly, the successive reading operations in the data reading circuit of FIG. 6 are the same as those performed in the circuit of FIG. 4. Therefore, description of these operations is not given here.

Based upon the foregoing, in the data reading circuit shown in FIG. 6 according to this third embodiment, a precharging operation similar to that of the first embodiment and the second embodiment is performed so that the same effect as that of the data reading circuits of FIG. 2 and FIG. 5 according to the first and the second embodiments is obtained.

In the description of the first to third embodiments, sense amplifier 1 had a structure as shown in FIG. 3. However, it is not intended to be restrictive, and sense amplifier 1 may be of any structure as long as it performs an operation similar to that of the sense amplifier shown in FIG. 3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A data reading circuit which operates in response to provision of supply voltage defined by first and second potentials for reading data conducted from a memory cell to an input/output line pair, comprising:

a sense amplifier which receives a first control signal, is activated in response to this first control signal, senses and amplifies a potential difference produced at said input/output line pair corresponding to data conducted from said memory cell to output a signal at a level corresponding to this potential difference;

a first tri-state inverter activated when said sense amplifier is activated for inverting, amplifying and then outputting the signal output from said sense amplifier;

a latching means for latching the signal output from said first tri-state inverter;

a second tri-state inverter which receives a second control signal, is activated in response to this second control signal, inverts and outputs the signal latched by said latching means; and an MOS transistor connected between an output node of said sense amplifier and an output node of said first tri-state inverter which is rendered conductive when said sense amplifier is not activated.

2. The data reading circuit in accordance with claim 1, further comprising an inverter for inverting the polarity of said first control signal, wherein said MOS transistor is an N channel MOS transistor which receives at its gate electrode a signal obtained after the inversion of said first control signal by said inverter and is activated when said sense amplifier is not activated in response to this signal.

* * * * *